(12) United States Patent
Pozder et al.

(10) Patent No.: US 6,958,548 B2
(45) Date of Patent: Oct. 25, 2005

(54) SEMICONDUCTOR DEVICE WITH MAGNETICALLY PERMEABLE HEAT SINK

(75) Inventors: Scott K. Pozder, Austin, TX (US); Michelle F. Rasco, Manor, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/716,655

(22) Filed: Nov. 19, 2003

(65) Prior Publication Data

US 2005/0104193 A1 May 19, 2005

(51) Int. Cl.$^7$ .......................... H01L 23/48; H01L 23/10
(52) U.S. Cl. ..................... 257/783; 257/706; 257/707; 257/782
(58) Field of Search ................... 438/109, 118, 438/122, 123, 125; 257/659, 660, 675, 706, 684–686, 707, 720, 723, 724, 777, 782, 783

(56) References Cited

U.S. PATENT DOCUMENTS 5,849,627 A * 12/1998 Linn et al. .................. 438/455
6,355,501 B1    3/2002 Fung
6,500,694 B1    12/2002 Enquist
6,761,813 B2 *  7/2004 Xu .............................. 205/114

OTHER PUBLICATIONS

Li et al., "Magnetic Nanoscales Dots on Colloid Crystal Surfaces," Applied Physics Letters, vol. 76, No. 6, 2000 American Institute of Physics, pp. 748–750.
Gross et al., "New Materials for High Performance No–Flow Underfill," 2002 International Symposium on Microelectronics, pp. 234–238.

* cited by examiner

Primary Examiner—Hung Vu
(74) Attorney, Agent, or Firm—James L. Clingan, Jr.; Michael P. Noonan

(57) ABSTRACT

A semiconductor device is attached to a heat sink by glue that is both thermally conductive and magnetically permeable. The glue fills different features in the surface of the semiconductor device so that there is good coupling between the semiconductor device and the heat sink. The glue is filled with magnetic particles so that the glue is magnetically permeable. The semiconductor device is formed with the heat sink at the wafer level and then singulated after attachment of the heat sink with the glue.

21 Claims, 1 Drawing Sheet

SEMICONDUCTOR DEVICE WITH MAGNETICALLY PERMEABLE HEAT SINK

FIELD OF THE INVENTION

This invention relates to semiconductors, and more particularly, to the manufacture of semiconductor devices having heat sinks attached thereto.

RELATED ART

A major issue in semiconductors is heat generation and the need to dissipate that heat. Also becoming important is various kinds of shielding. For example in magnetoresistive random access memories (MRAMs) the logic state of the memory cell is changed by application of magnetic fields. Thus strong spurious magnetic signals can detrimentally alter the state of such a memory. Also RF can detrimentally affect logic. One of the difficulties with such shielding is the coupling of the shielding to a stacked semiconductor device. One of the proposed solutions is to bond wafers together using glass to glass bonding. One difficulty with this approach is that the glass must be very thin to obtain good coupling and planarity of the glass surfaces being bonded, and the wafers must exhibit a high degree of planarity. If there is not sufficient planarity, there is not good coupling.

Thus, there is a need for heat sinks that overcome these difficulties.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor device is attached to a heat sink by glue that is both thermally conductive and magnetically permeable. The glue fills different features in the surface of the semiconductor device so that there is good coupling between the semiconductor device and the heat sink. The glue is filled with magnetic particles so that the glue is magnetically permeable. This is better understood by reference to the drawings and the following description.

Figure 1:
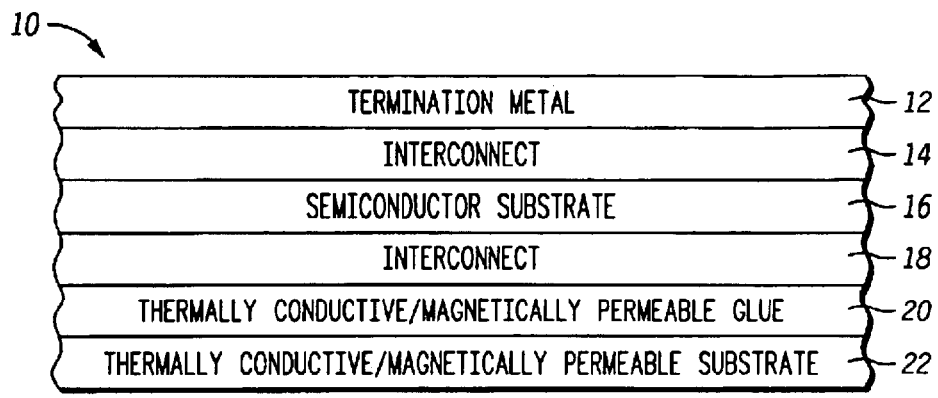
FIG. 1 is cross section of a semiconductor device with an attached heat sink according to an embodiment of the invention.

Shown in FIG. 1 is semiconductor device 10 comprising a final metal layer 12, an interconnect layer 14, a semiconductor substrate 16, and an interconnect 18. Also shown in FIG. 1 is a thermally conductive/magnetically permeable substrate 22 coupled to semiconductor device 10 by a thermally conductive/magnetically permeable glue layer 20. Substrate 22 can also be considered a heat sink 22. Semiconductor substrate 16 preferably comprises silicon having transistors formed therein so that it is an active semiconductor substrate. Interconnect layers 14 and 18 are for providing interconnections between different transistors and between transistors and power supply voltages. In this example, interconnect layer 14 is shown as being on a top side of semiconductor substrate 16 and interconnect layer 18 is shown as being on a bottom side of semiconductor substrate 16. A final metal layer 12 is on interconnect layer 14 and provides connections for mounting the semiconductor device. Layers 12–22 are originally assembled at the time semiconductor substrate 16 is a semiconductor wafer prior to the time die on the wafer are singulated. This semiconductor device 10 is a magnetoresistive access memory in this described embodiment but may alternatively be another type of semiconductor circuit.

Interconnect layer 18 is formed on semiconductor substrate 16 on the same side of semiconductor substrate as the gates of transistors are formed. Substrate 22 is attached to interconnect layer 18 by glue layer 20. Semiconductor substrate 16 is then ground down to be a thinned substrate having a thickness of about 50 microns. Interconnect layer 14 is then formed followed by the last metal layer which forms final metal layer 12. In the preferred case, the final metal layer has bumps which are used to connect to flip-chip package structure. After the formation of final metal layer 12, the resulting device is singulated into individual die ready for packaging as desired. Thus, the formation of device 10 is formed at the wafer level prior to singulation of the individual die.

Glue layer 20 comprises a glue that is both thermally conductive and magnetically permeable. An example of such glue is a nanosilicate underfill available from 3M Corporation. The particular viscosity and type of metal are selectable for the particular manufacturing and device characteristics desired. In this case, the particles used for the colloid fill are cobalt but could also be something else such as nickel or iron or combinations of any of the three. Also other magnetically permeable materials could be used. The fill particles can be metal coated nanosilica or glass spheres and that coating can be magnetic nickel, cobalt, iron or other magnetic materials. For the designs where magnetic shielding is not desired, then other materials such as carbon, aluminum, metal oxides, and other metals could be used to give varying degrees of thermal and electrical conductivity. The epoxy, bonding agent 34 in this case, in combination with the colloid fill materials is also thermally conductive. The magnetic permeability of the particles used as the colloid fill provide for magnetic shielding from the bottom. In the attachment process, the remaining portion of semiconductor device 10 would receive shielding. For example, in the case of flip-chip, a magnetic fillet could be used.

Figure 2:
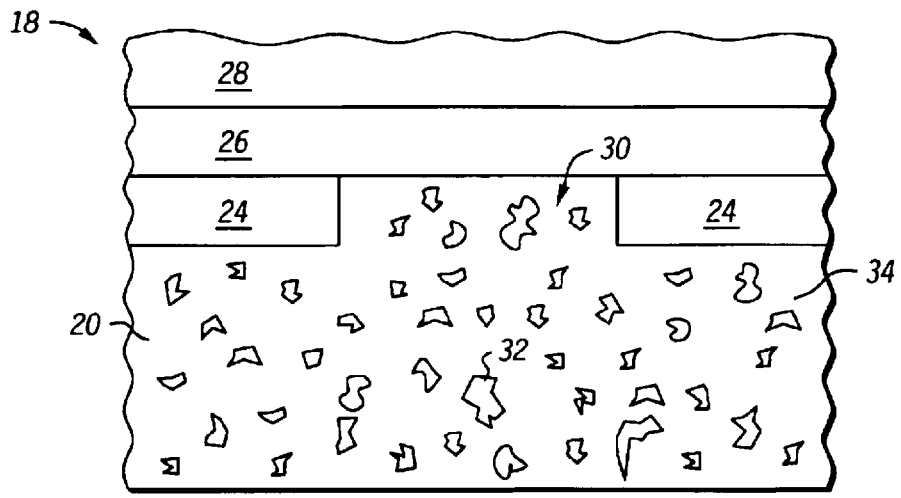
FIG. 2 is a cross section showing more detail of that depicted in FIG. 1.

Portions of glue layer 20 and interconnect layer 18 are shown in more detail in FIG. 2. The portion of interconnect layer 18 shown in FIG. 2 comprises a dielectric layer 24 on glue layer 20, a metal layer 26 on dielectric layer 24, and a dielectric layer 28 on metal layer 26. An opening 30 in dielectric layer 24 results in glue layer 20 be in contact with metal layer 24 through opening 24. Preferably metal layer 26 is for being connected to ground. Particle 32 is an exemplary particle of the colloid fill. Particle 32 has an irregular shape, but there may be situations in which another shape, such as spherical, may be beneficial.

Another material that can be useful as glue layer 20 is benzocyclobutene (BCB) with colloidal particles such as those already described embedded therein. BCB itself is not thermally conductive, magnetically permeable, or conductive, but it is a very effective glue. With the embedded particles, it provides for magnetic permeability as well as thermal conductivity. With the colloidal particle density as shown in FIG. 2, glue layer 20 will not be electrically conductive. The colloidal particle density can, however, be increased so that glue 20 can be electrically conductive. In such case the resulting glue is electrically conductive, thermally conductive, and magnetically permeable. This electrical conductivity is beneficial if it is desirable to make electrical contact between substrate 22 and the ground of semiconductor substrate 16. A thickness of 1 to 2 microns is a desired thickness for glue layer 20. By being this thick and being spun-on, glue layer 20 provides for good coupling even if the surfaces of interconnect 18 and substrate 22 are not fully planar. In fact glue layer 20 provides for the opportunity to make direct contact between glue layer 20 and metal layer 26. The desired thermal conductivity of glue layer 20 is at least 1 watt/meter-degree where degree is stated in Kelvin. The desired magnetic permeability is balanced against the ability to spin the glue because the viscosity increases with increasing metal content. The permeability will increase with metal content, and the fill epoxy will be permeable in proportion to the magnetic material contained within the glue.

An effective material for substrate 22 is silicon carbide coated with nickel. Silicon carbide provides good thermal conductivity, and nickel provides good magnetic permeability. Other magnetic materials such as cobalt and iron can be used. If glue layer 20 is sufficiently magnetically permeable for the particular application, then the nickel coating may not be necessary. In such case substrate 22 would not itself be magnetically permeable. The silicon carbide material is beneficial for this application also because of its coefficient of thermal expansion (CTE), which can be effectively matched to that of silicon.

Figure 3:
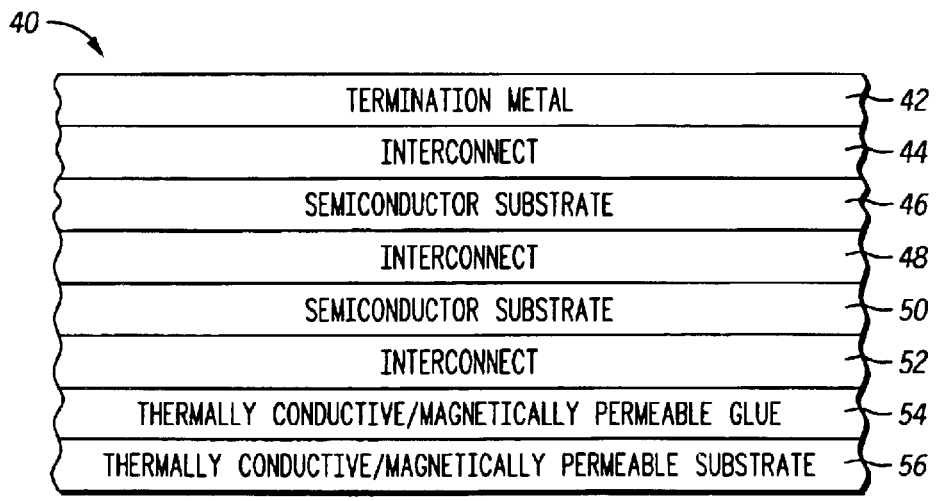
FIG. 3 is a cross section of a semiconductor device with an attached heat sink according to another embodiment of the invention.

Shown in FIG. 3 is a semiconductor device 40 comprising a final metal layer 42, an interconnect layer 44, a semiconductor substrate 46, an interconnect layer 48, a semiconductor substrate 50, and an interconnect layer 52. Similar to semiconductor device 10 of FIG. 1, a thermally conductive/magnetically permeable substrate 56 is coupled to semiconductor device 40 at interconnect 52 by a conductive/magnetically permeable glue layer 54. This substrate 56 and glue layer 54 are the same as substrate 22 and glue layer 20 of FIG. 1. Semiconductor device 40 is different from semiconductor device 10 by having an additional semiconductor substrate and interconnect layer. This shows the applicability of glue layer 54 and substrate 56 to three dimensional wafer structures. The interface between glue layer 54 and interconnect layer 52 may have a portion that is the same as that shown for the interface between glue layer 20 and interconnect layer 18 shown in FIG. 2. The formation process follows that for the structure of FIG. 1 through the formation of interconnect layer 14 which is analogous to interconnect layer 48. After the formation of interconnect layer 48, semiconductor substrate is applied followed by the formation of interconnect layer 44 and then final metal layer 42. This structure of FIG. 3 is thus originally formed at the wafer level then singulated.

In the foregoing specification, the invention has been described with reference to specific embodiments. However, one of ordinary skill in the art appreciates that various modifications and changes can be made without departing from the scope of the present invention as set forth in the claims below. For example, other materials than those described for the various layers may be used. Additional semiconductor substrate layers may be used. The semiconductor substrates may be different from silicon and may be different from each other as well. The semiconductor substrates may be considered to have just one or more than one integrated circuit present. In practice the substrates are bonded together as wafers and then singulated but this could be done in a different way. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus comprising:
    a thinned active semiconductor substrate;
    a support substrate for supporting the thinned active semiconductor substrate; and
    a magnetically permeable glue disposed between the active semiconductor substrate and the support substrate.

2. The apparatus of claim 1 wherein the support substrate is magnetically permeable.

3. The apparatus of claim 2 wherein the support substrate and the glue each comprise a magnetically permeable substance, the magnetically permeable substance comprising at least one of the group consisting of cobalt; nickel and iron.

4. The apparatus of claim 3 wherein the support substrate comprises:
    a first layer having a coefficient of thermal expansion substantially equal to the thinned active semiconductor substrate, the first layer being in contact with the glue; and
    a second layer coupled to the first layer, the second layer comprising the magnetically permeable substance.

5. The apparatus of claim 3 wherein the active semiconductor substrate comprises a magnetoresistive random access memory.

6. The apparatus of claim 1 wherein the glue comprises:
    a bonding agent; and
    a magnetic permeability enhancing agent.

7. The apparatus of claim 6 wherein the bonding agent comprises one of the group consisting of benzocyclobutene (BCB) and an epoxy.

8. The apparatus of claim 6 wherein the magnetically permeable enhancing agent comprises at least one of the group consisting of cobalt, nickel and iron.

9. The apparatus of claim 6 wherein the magnetic permeability enhancing agent comprises a plurality of magnetically-permeable, colloidal-sized particles suspended in the bonding agent.

10. The apparatus of claim 9 wherein the glue has a first thickness and the particles have an average maximum dimension not substantially greater than half the first thickness.

11. The apparatus of claim 9 wherein the active semiconductor substrate has a thickness of less than 200 microns.

12. An apparatus comprising:

a thinned integrated circuit wafer;

a support wafer being magnetically permeable and comprising at least one of the group consisting of cobalt, nickel, and iron; and a glue being magnetically permeable, the glue being disposed between the integrated circuit wafer and the support wafer and comprising at least one of the group consisting of cobalt, nickel, and iron.

13. The apparatus of claim 12 wherein the integrated circuit wafer comprises a plurality of the integrated circuits.

14. The apparatus of claim 13 wherein the apparatus comprises a three-dimensional wafer-to-wafer bonded structure including the integrated circuits, the support wafer, and the glue.

15. The apparatus of claim 12 wherein the glue comprises:

a bonding agent; and an agent that enhances magnetic permeability.

16. The apparatus of claim 15 wherein the bonding agent comprises one of the group consisting of benzocyclobutene (BCB) and an epoxy.

17. The apparatus of claim 12 wherein the support wafer comprises:

a first layer having a coefficient of thermal expansion substantially equal to the thinned integrated circuit wafer, the first layer having the first surface; and a second layer comprising the magnetically permeable substance.

18. The apparatus of claim 12 wherein the integrated circuit wafer comprises a magnetic memory.

19. The apparatus of claim 12 wherein the support wafer comprises one of the group consisting of silicon carbide and heavily doped silicon.

20. An apparatus comprising:

a thinned integrated circuit wafer;

a support wafer having a first characteristic, the first characteristic being at least one of the group consisting of thermally conductive, electrically conductive and magnetically permeable; and a glue having the first characteristic, the glue being disposed between the integrated circuit wafer and the support wafer;

wherein the glue comprises: a bonding agent; and a first characteristic enhancing agent;

wherein the first characteristic enhancing agent comprises a plurality of colloidal-sized particles suspended in the bonding agent, the colloidal particles being monolithic and coated nanosilica spheres.

21. The apparatus of claim 20 wherein the glue has a first thickness and the particles have an average maximum dimension not substantially greater than half the first thickness.

* * * * *